(12) United States Patent
Ostholt et al.

(10) Patent No.: US 11,515,259 B2
(45) Date of Patent: Nov. 29, 2022

(54) METHOD AND DEVICE FOR THE INTEGRATION OF SEMICONDUCTOR WAFERS

(71) Applicant: LPKF Laser & Electronics AG, Garbsen (DE)

(72) Inventors: Roman Ostholt, Langenhagen (DE); Norbert Ambrosius, Garbsen (DE)

(73) Assignee: LPKF LASER & ELECTRONICS AG, Garbsen (DE)

( * ) Notice: Subject to any disclaimer, the term of this patent is extended or adjusted under 35 U.S.C. 154(b) by 0 days.

(21) Appl. No.: 16/762,446

(22) PCT Filed: Oct. 17, 2018

(86) PCT No.: PCT/EP2018/078361
§ 371 (c)(1),
(2) Date: May 7, 2020

(87) PCT Pub. No.: WO2019/091728
PCT Pub. Date: May 16, 2019

(65) Prior Publication Data
US 2020/0266152 A1 Aug. 20, 2020

(30) Foreign Application Priority Data

Nov. 10, 2017 (DE) .................... 10 2017 126 410.8
Jul. 9, 2018 (DE) ..................... 10 2018 211 313.0

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01); (Continued)

(58) Field of Classification Search
CPC ............. H01L 23/5389; H01L 21/4853; H01L 21/4857; H01L 21/561; H01L 21/565; (Continued)

(56) References Cited

U.S. PATENT DOCUMENTS 4,479,140 A * 10/1984 Horvath ................ H01L 23/433
257/713
6,716,670 B1  4/2004 Chiang
(Continued)

FOREIGN PATENT DOCUMENTS

DE  102006033175 A1  1/2008
DE  102007022959 A1  11/2008
(Continued)

*Primary Examiner* — Vu A Vu
(74) *Attorney, Agent, or Firm* — Browdy and Neimark, PLLC

(57) ABSTRACT

A method for the integration of semiconductor components in a confined space, in particular for 3D integration, in which, after positioning relative to a carrier substrate and/or a redistribution layer, the semiconductor components are protected and fixed in their relative position by introduction of a potting compound, characterized in that before the introduction of the potting compound, a glass substrate having a multiplicity of cutouts separated by partition walls and serving to receive a semiconductor component, is positioned in such a way that the semiconductor component is enclosed by the sidewall surfaces—facing it—of the respective partition walls of the glass substrate.

31 Claims, 6 Drawing Sheets

(51) Int. Cl.
  *H01L 21/56* (2006.01)
  *H01L 21/683* (2006.01)
  *H01L 23/31* (2006.01)
  *H01L 23/00* (2006.01)

(52) U.S. Cl.
  CPC .......... *H01L 21/561* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 24/96* (2013.01); *H01L 2221/68372* (2013.01); *H01L 2224/214* (2013.01); *H01L 2224/95001* (2013.01)

(58) Field of Classification Search
  CPC ............... H01L 21/568; H01L 21/6835; H01L 23/3128; H01L 23/5383; H01L 23/5386; H01L 24/19; H01L 24/20; H01L 24/96; H01L 2221/68372; H01L 2224/214; H01L 2224/95001; H01L 2224/12105; H01L 2924/14; H01L 2924/1431; H01L 2924/1432; H01L 2924/1434; H01L 2924/3511; H05K 1/185
  USPC ......................................................... 257/668
  See application file for complete search history.

(56) References Cited

U.S. PATENT DOCUMENTS

| | | | |
|---|---|---|---|
| 7,763,969 | B2* | 7/2010 | Zeng .................... H01L 23/5389 |
| | | | 257/700 |
| 8,584,354 | B2* | 11/2013 | Cornejo .................. C03C 15/00 |
| | | | 29/852 |
| 9,099,479 | B2* | 8/2015 | Oganesian .............. H01L 24/18 |
| 2008/0123318 | A1 | 5/2008 | Lam |
| 2010/0225001 | A1 | 9/2010 | Hizume |
| 2012/0313245 | A1 | 12/2012 | Horiuchi et al. |
| 2013/0194764 | A1 | 8/2013 | Mikado et al. |
| 2014/0091473 | A1 | 4/2014 | Len et al. |
| 2014/0144686 | A1 | 5/2014 | Shimizu |
| 2014/0182897 | A1 | 7/2014 | Lee et al. |
| 2015/0069623 | A1 | 3/2015 | Tsai et al. |
| 2015/0303174 | A1 | 10/2015 | Yu et al. |
| 2016/0071779 | A1 | 3/2016 | Chen |
| 2017/0207204 | A1 | 7/2017 | Lin et al. |
| 2019/0295944 | A1* | 9/2019 | Kwon ................. H01L 25/0655 |

FOREIGN PATENT DOCUMENTS

| | | |
|---|---|---|
| JP | 2010-205877 A | 9/2010 |
| JP | 2016-092107 A | 5/2016 |
| JP | 2016092107 A | 5/2016 |
| WO | 2008057895 A1 | 5/2008 |
| WO | 2018017246 A1 | 1/2018 |

* cited by examiner

METHOD AND DEVICE FOR THE INTEGRATION OF SEMICONDUCTOR WAFERS

CROSS-REFERENCE TO RELATED APPLICATIONS

This application claims the priority of German Patent Application Serial No. DE 10 2017 126 410.8, filed on Nov. 10, 2017, and German Patent Application Serial No. DE 10 2018 211 313.0, filed on Jul. 9, 2018, pursuant to 35 U.S.C. 119(a)-(d), the content of which is incorporated herein by reference in its entirety as if fully set forth herein.

FIELD OF THE INVENTION

The invention relates to a method for the integration of semiconductor wafers in a confined space, in particular 3D integration, in which, after positioning relative to a substrate and/or a redistribution layer (RDL), the semiconductor wafers are protected and fixed in their relative position by introduction of a potting compound. Furthermore, the invention relates to a device for use in the method, and to a corresponding integrated semiconductor wafer device as a fabrication intermediate product and also as an end product.

BACKGROUND OF THE INVENTION

The semiconductor industry has undergone rapid growth owing to continuous improvements in the integration density of various electronic components. For the most part, this improvement in the integration density emerges from repeated reductions of the minimum feature size, such that more components can be integrated into a specific area.

Since the demand for miniaturization, higher speed and larger bandwidth and also lower power consumption has risen in recent times, this has given rise to a need for smaller and more creative packaging techniques for unpackaged semiconductor wafers, also referred to as dies.

In the course of advancing integration, more and more assemblies that were previously mounted as individual semiconductor wafers next to one another on a circuit board are being combined in one "larger" semiconductor wafer. Here, "larger" is taken to mean the number of circuits on the die, since the absolute size can decrease as a result of advancing refinement of the fabrication process.

In a stacked semiconductor device, active circuits such as logic, memory, processor circuits and the like are at least partly produced on separate substrates and then physically and electrically bonded to one another in order to form a functional device. Such bonding processes use highly developed techniques, wherein improvements are desired.

A combination of two mutually complementary assemblies such as, for example, CPU and cache on a semiconductor wafer can be described by the term "on-die": the CPU has the cache "on-die", that is to say directly on the same semiconductor wafer, which significantly accelerates data exchange. Construction and connection technology (CCT) is concerned with the further processing of the semiconductor wafer packaging and integration into the circuitry environment.

Many integrated circuits are usually produced on a single semiconductor wafer and individual semiconductor wafers on the wafer are singulated by the integrated circuits being sawn along a scribe line. The individual semiconductor wafers are usually encapsulated separately, for example in multi-semiconductor wafer modules or in other types of packages (packaging).

A wafer level package (WLP) structure is used as a package structure for semiconductor components of electrical products. An increased number of electrical input/output (I/O) contacts and an increased demand for high-performance integrated circuits (ICs) have led to the development of WLP structures of the fan-out type, which allow further center-to-center distances for the electrical I/O contacts.

This involves the use of an electrical redistribution structure comprising one or more electrical redistribution layers (RDLs). Each RDL can be designed as a structured metallization layer and serves as an electrical interconnect designed for connecting the electronic component embedded into the encapsulation to the external connections of the semiconductor component package and/or one or more electrode(s) of the semiconductor wafer(s) arranged at the underside of the semiconductor component package.

DE 10 2007 022 959 A1 discloses a semiconductor package in which a semiconductor wafer is embedded into a potting compound. A redistribution layer is provided with solder balls for surface mounting of the semiconductor wafer package. Through contacts through the semiconductor package are provided with solder material on a surface of the semiconductor package, by means of which a second semiconductor package can be stacked on the first.

U.S. Pat. No. 6,716,670 B1 discloses a semiconductor wafer package for surface mounting. Contacts are provided at a main surface, and a second semiconductor wafer package can be attached to said contacts.

DE 10 2006 033 175 A1 discloses an electronics module comprising a logic part and a power part. Logic part and power part are arranged on substrates arranged one above another and are potted jointly.

Moreover, US 2014/0091473 A1 and US 2015/0069623 A1 describe the 3D semiconductor wafer integration of TSMC, wherein semiconductor wafers are potted in synthetic resin and through plating is implemented as through silicon vias or metal webs are embedded into the potting compound.

Furthermore, US 2015/0303174 A1 relates to complex 3D integration and US 2017/0207204 A1 relates to "integrated fan out packaging".

The introduction of the potting compound can result in a relative displacement of the semiconductor wafers among one another and also relative to a predetermined desired position of the semiconductor wafer. In addition, stresses occur on account of the shrinkage of the potting compound caused by solidification, which stresses can result in an uneven deformation. Furthermore, the semiconductor wafers on the substrate drift on account of the dynamic forces of the potting compound flowing in. It is also already known that the processing of the rear-side metallization can lead to warpage problems.

SUMMARY OF THE INVENTION

The invention is based on the object of affording a possibility of avoiding the disadvantageous influences associated therewith.

This object is achieved according to the invention by a method for the integration of semiconductor wafers, in particular semiconductor components in a confined space, in particular for 3D integration, in which, after positioning relative to a carrier substrate and/or a redistribution layer (RDL), the semiconductor wafer(s), in particular semiconductor component(s), is/are protected and fixed in its/their relative position by introduction of a potting compound, wherein before the introduction of the potting compound, a glass substrate having a multiplicity of cutouts separated by partition walls and serving to receive in each case at least one semiconductor wafer, in particular semiconductor component, is positioned in such a way that the at least one semiconductor wafer, in particular semiconductor component, is enclosed by the sidewall surfaces—facing it—of the respective partition walls of the glass substrate.

The invention thus provides a method in which, before the introduction of potting compound, a substrate composed of glass having a multiplicity of cutouts separated by wall surfaces, or expressed more aptly "partition walls", and serving for receiving one or more semiconductor wafers is positioned or fixed relative to the semiconductor wafers in such a way that at least individual semiconductor wafers are separated from one another by the partition wall of the glass substrate. In other words, by virtue of one or more semiconductor wafers being arranged in a respective cutout and being arranged in a manner separated from other semiconductor wafers, they are optimally protected against the undesired influences as a result of the introduction of the potting compound. It has already been found in experiments that the glass substrate limits the displacement of the semiconductor wafers parallel to the main plane of extent of the substrate or of the plastic substrate carrying the semiconductor wafers to less than 100 μm, and to less than 10 μm depending on the embodiment. For this purpose, the glass substrate forms a mask having the cutouts adapted to the semiconductor wafers, which cutouts can preferably already have been equipped with through holes (Through Glass Via: TGV) and enable through plating.

According to the invention, the glass substrate precludes an undesired displacement of the semiconductor wafer as well as a deformation of the carrier substrate on account of the considerably reduced amount of potting material. Furthermore, an expansion, in particular thermal expansion or on account of altered moisture, is also avoided. In this case, the increased modulus of elasticity of the glass substrate also has a positive effect on the production process and on the device properties. Moreover, the use of the glass substrate results in improved RF properties resulting in diverse practical applications in radio-frequency technology.

By virtue of the fact that the glass substrate is processed by laser radiation by means of nonlinear self-focusing and is subsequently subjected to anisotropic material removal by means of etching with an adapted etching rate and duration, for the first time virtually planar sidewall surfaces of the partition walls are produced as boundary surfaces of the cutouts in the substrate, with the result that the semiconductor wafers can be arranged at a very small distance from the sidewall surfaces and hence also from adjacent semiconductor wafers.

In the method for producing the cutouts forming the sidewall surfaces in the glass substrate, use is made of laser induced deep etching, which has become known by the designation LIDE. In this case, the LIDE method makes it possible to introduce extremely precise holes (Through Glass Via=TGV) and structures at very high speed and thus provides the prerequisites for the production of the glass substrate.

In principle, it is assumed that, after the semiconductor wafers have been positioned either on a carrier layer or on a redistribution layer (RDL), the glass substrate is connected to said layer, wherein the partition walls between the cutouts enclose the semiconductor wafers in each case on all sides.

Furthermore, it is also conceivable to fix the semiconductor wafers in the glass substrate independently of a carrier layer or other layer, with the result that semiconductor wafers and glass substrate form a structural unit that can be used for the further production process.

As a result, it is also possible to realize a method in which the semiconductor wafers are potted within the cutouts of the glass substrate. For this purpose, the semiconductor wafers can be fitted in the glass substrate, such that the substrate could optionally be omitted.

Furthermore, the object according to the invention is also achieved by the glass substrate being equipped with a multiplicity of cutouts, which are also referred to as cavities, which enclose the semiconductor wafers with a small gap or even in an adjoining fashion, wherein the cutouts are bounded by sidewall surfaces which have a largely planar course, that is to say in particular have no reduced clear width between the surfaces of the glass substrate or no wall surface region extending convexly into the cutout.

In this case, the wall surface can have a V-shaped course, that is to say a continuously increasing clear width of the cutout, wherein the gradient can preferably be embodied as constant without a turning point.

By virtue of the fact that a transparent, translucent or transmissive potting compound, for example a polymer, is used, according to the invention it is also possible to realize an optical connection between different semiconductor wafers.

One specific embodiment of the method according to the invention, wherein at the respective sidewall surface one or more projections and/or spring elements are used for fixing the semiconductor components, is characterized by the following method steps:

providing a carrier substrate having at least one semiconductor wafer, in particular semiconductor component, secured thereon by way of an adhesive layer, providing a glass substrate having at least one cutout, positioning the glass substrate on the adhesive layer of the carrier substrate in such a way that the at least one semiconductor wafer, in particular semiconductor component is arranged in the at least one cutout, embedding the at least one semiconductor wafer, in particular semiconductor component, in the at least one cutout by means of a potting compound, and removing carrier substrate and adhesive film from the remaining package comprising semiconductor wafer, glass substrate and potting compound.

In one preferred development, a redistribution layer and contact elements, in particular solder balls, thereon can then be applied to the package with electrical contact with the at least one semiconductor wafer, in particular semiconductor component.

As a preferred development from the standpoint of device technology, an integrated semiconductor wafer device, in particular an integrated semiconductor component arrangement, as a fabrication intermediate product preferably produced according to the method according to the invention is characterized by the following features:

a carrier substrate, an adhesive film arranged thereon, at least one semiconductor wafer, in particular semiconductor component, secured on said adhesive film, and a glass substrate secured on the adhesive film and having cutouts forming partition walls between them, in each of which cutouts one or more of the semiconductor wafers, in particular semiconductor components, are embedded with a potting compound.

As a finished end product that can be produced therefrom, the invention provides an integrated semiconductor wafer device in which, as a result of removing the carrier substrate and the adhesive film, there remains a glass substrate having cutouts forming partition walls between them, in each of which cutouts one or more semiconductor wafers, in particular semiconductor components, are embedded with a potting compound. Furthermore, the device comprises a redistribution layer in electrical contact with said one or more semiconductor wafers, in particular semiconductor components, and contact elements, in particular solder balls, on the redistribution layer.

Intermediate and finished products avoid the disadvantages from the prior art which have already been described above in association with the method according to the invention. Further preferred embodiments of the integration method relate to specific features and parameters of the device according to the invention, which are explained in greater detail in the description of the exemplary embodiments in order to avoid unnecessary repetitions.

The invention accordingly permits various embodiments. For further elucidation of the basic principles, a plurality of such exemplary embodiments are illustrated in the drawings and described below.

DESCRIPTION OF THE PREFERRED EMBODIMENTS

Figure 1:
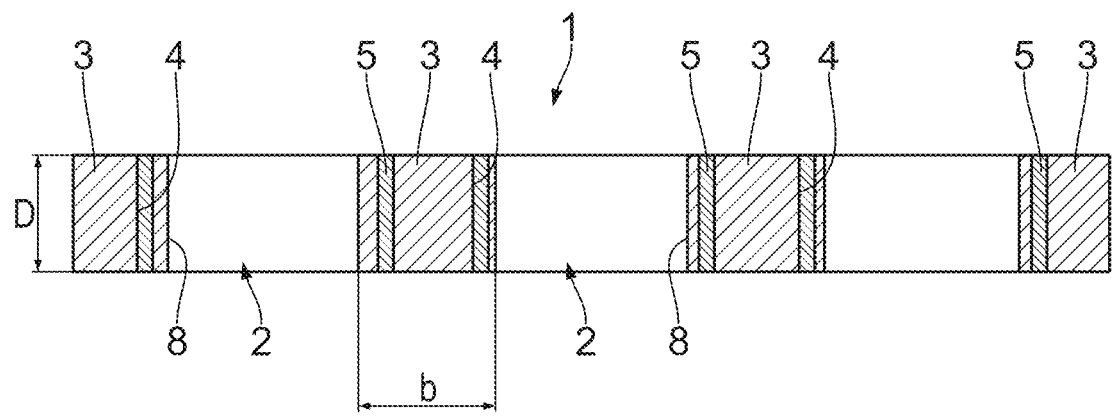
FIG. 1 shows a vertical sectional illustration of a glass substrate having cutouts and through contacts (TGV) in a first embodiment.

FIG. 1 shows the most important features of the glass substrates 1 according to the invention in a manner representative of all embodiments. A glass substrate 1 having the thickness D is provided with a plurality of cutouts 2 in a distance b. Through holes 4—so-called "through glass vias", abbreviated to TGV—are created in the partition walls 3 of the glass substrate 1 that surround the cutouts 2, a metallization 5 being introduced into said through holes in a customary manner. The glass substrate 1 at least substantially consists of an alkali-free glass, in particular an alumoborosilicate glass or borosilicate glass.

Figure 2:
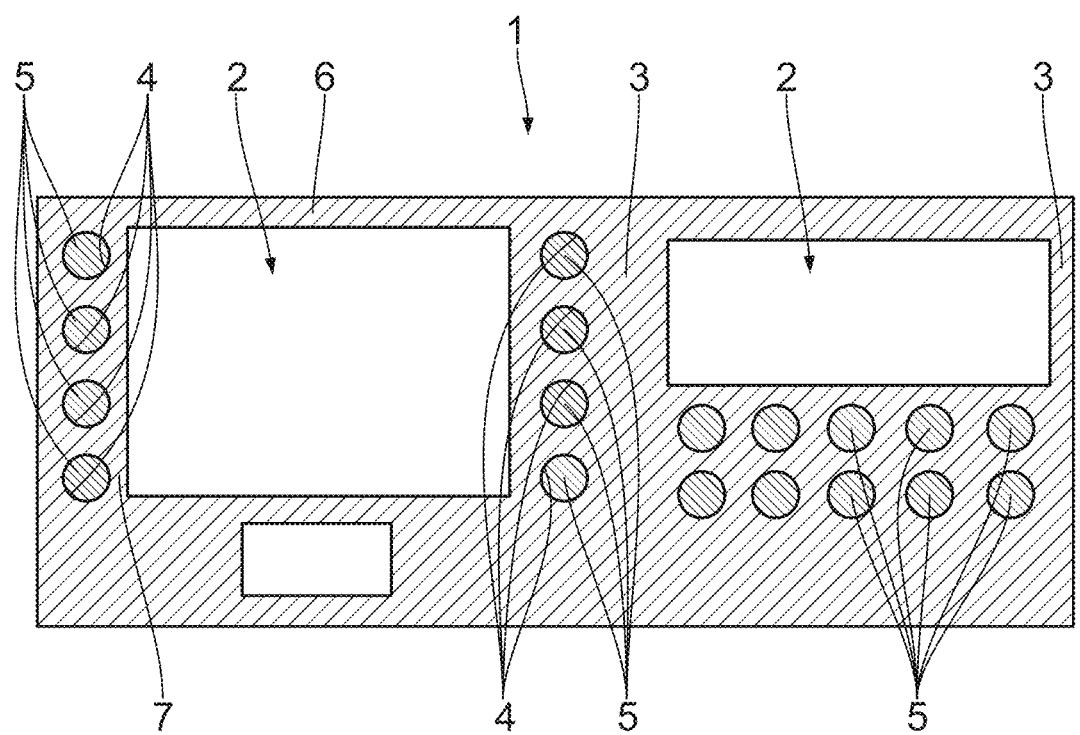
FIG. 2 shows a horizontal sectional illustration of a glass substrate having cutouts and through contacts in a second embodiment.

FIG. 2 illustrates the plan view of a similar glass substrate 1, which in turn has rectangular cutouts 2 in plan view. In the region of the partition walls 3, on both sides of the cutout 2 illustrated on the left in FIG. 2, through holes 4 flanking the narrow sides 6, 7 of said cutout at a distance therefrom are introduced. Further such through holes 4 lie in two rows parallel below the cutout 2 illustrated on the right in FIG. 2.

The cutouts 2 can be embodied—as is illustrated in FIG. 1—as continuous through openings, but also as blind holes.

Figure 3:
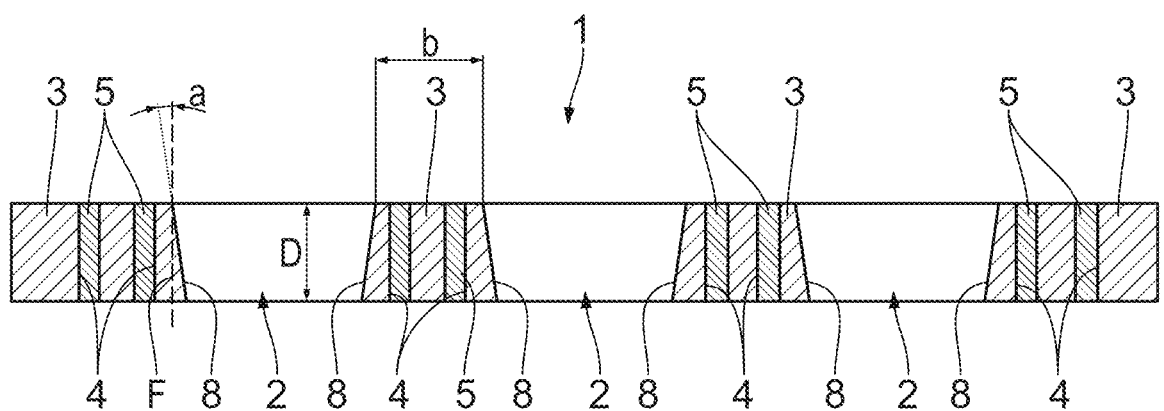
FIG. 3 shows a vertical sectional illustration of a glass substrate having cutouts and through contacts in a third embodiment.

In the embodiment of a glass substrate 1 in accordance with FIG. 3, cutouts 2 with intermediate partition walls 3 are once again introduced. In this case, however, the opposite sidewall surfaces 8 of the cutouts 2—unlike in the embodiment in accordance with FIG. 1—are not arranged perpendicular to the main plane of the glass substrate 1, but rather open in a V-shaped manner upward relative to FIG. 3 by virtue of the fact that the sidewall surfaces 8 assume a flank angle a relative to the surface normal F to the glass substrate 1 which can be up to 10°, in particular up to 8° or 5°. The side surfaces 8 need not necessarily be planar; they can also form an hourglass-shaped course with the opposite side surface 8.

The further geometric proportions in the case of the glass substrates 1 in accordance with FIGS. 1 and 3 respectively are presented as follows: its material thickness D can be for example <500 µm, preferably <300 µm or even more preferably <100 µm. The wall thickness b of the partition walls 3 is <500 µm, preferred gradations being <300 µm, <200 µm, <100 µm or <50 µm and is preferably less than the material thickness D of the glass substrate 1. Accordingly, the ratio b/D of the maximum remaining wall thickness b between two cutouts 2 in the glass substrate 1 to the material thickness D thereof can be <1:1, preferably <2:3, <1:3 or <1:6.

The size of the cutouts 2 in the glass substrate 1 is chosen, in principle, such that they can receive semiconductor components 9 at the smallest possible distance from the sidewall surfaces 8. The positions of the cutouts 2 are chosen such that they correspond to the desired later positioning of the semiconductor components 9 in an integrated semiconductor component arrangement—a so-called "chip package" or "fan-out package".

Figure 4A:
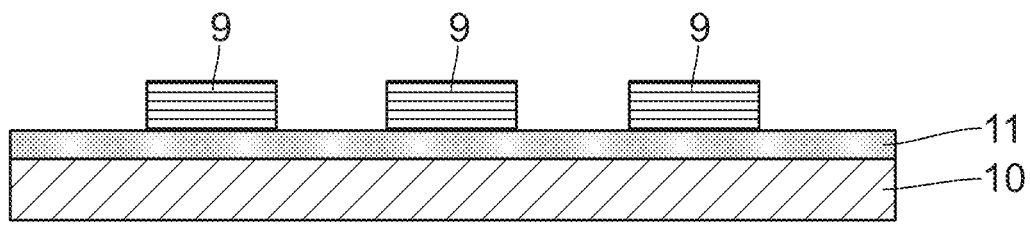
FIG. 4a-4f show a flowchart when carrying out the method according to the invention for the integration of semiconductor wafers.
Figure 4B:
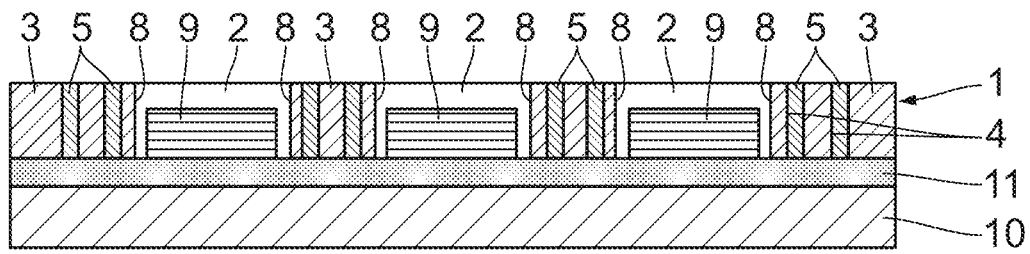

FIGS. 4a-4f then show schematically how a glass substrate 1 according to the invention can be used in the production of a chip package. FIG. 4a shows, as the initial situation, a carrier substrate 10 provided with an adhesive film 11, onto which the semiconductor components 9 are positioned. In FIG. 4b, the glass substrate 1 provided previously is placed onto the adhesive film 11, wherein the abovementioned small distance between the sidewall surfaces 8 of the partition walls 3 and the sides of the semiconductor components 12 opposite them is <30 µm, preferably <20 µm, <10 µm or <5 µm.

Subsequently, in FIG. 4c, a potting compound 12 is potted into the cutouts 2 in order to fix the semiconductor components 9 in their position within the glass substrate 1. In FIG. 4d, the adhesive film 11 with the carrier substrate 10 is detached. A compact unit of the glass substrate 1, through holes 4 with metallization 5 introduced into said glass substrate and semiconductor components 9 embedded into the potting compound 12 is thus present. Subsequently, in FIG. 4e, a redistribution layer—a so-called "RDL"—13 is applied on the side of the unit on which the electronic components 9 are exposed—this is the top side in FIG. 4e after the unit has been turned. Finally, as is discernible in FIG. 4f, solder balls 14 for contacting the semiconductor components are applied at corresponding connection points (not illustrated) of the redistribution layer 13.

Figure 4C:
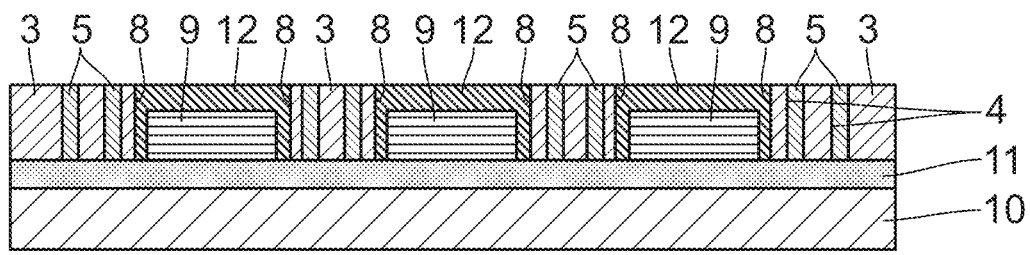
Figure 4D:
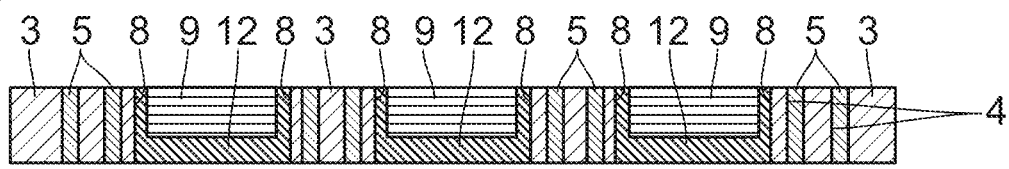
Figure 4E:
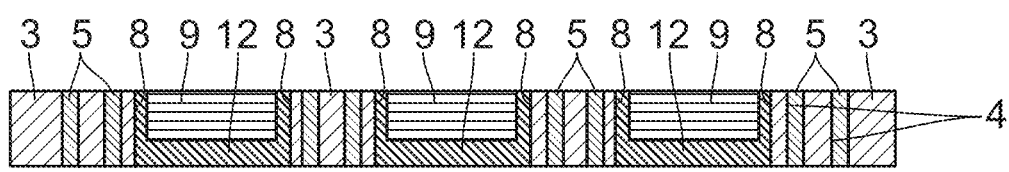
Figure 4F:
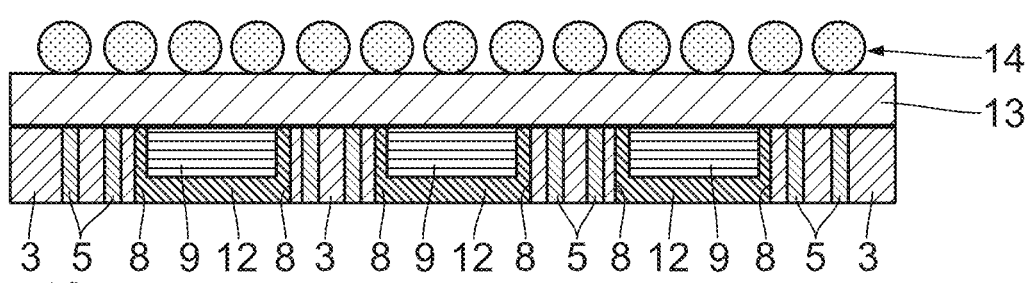
Figure 5A:
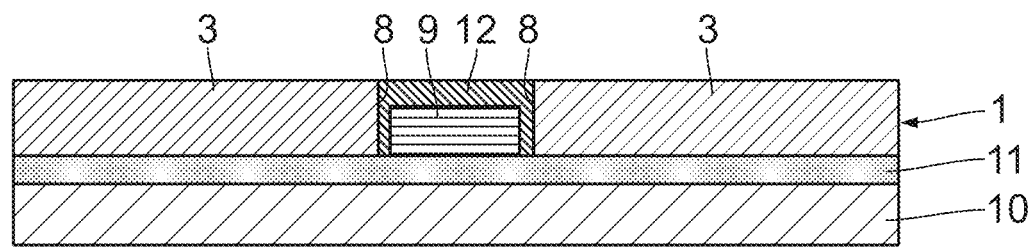
FIG. 5a-5d show vertical sectional illustrations of various embodiments of an integrated semiconductor wafer device as a fabrication intermediate product.
Figure 5B:
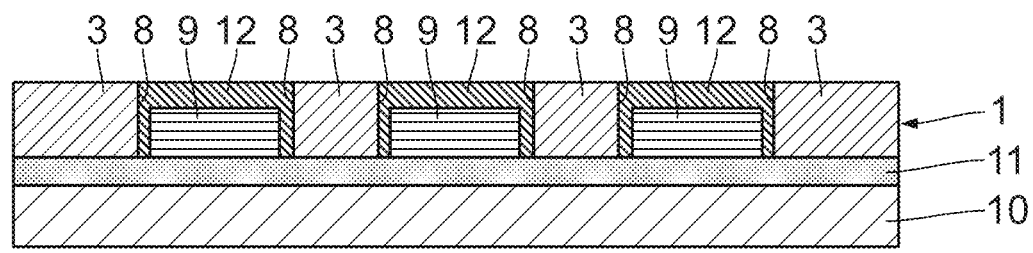
Figure 5C:
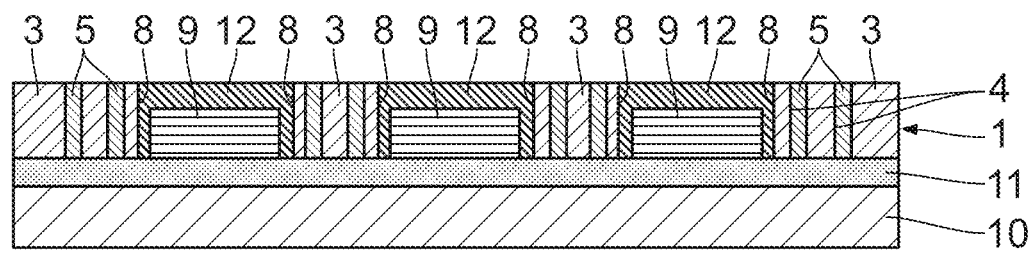

FIGS. 5a-5d show various embodiments of an integrated semiconductor component arrangement which were processed in each case up to FIG. 4c. A fabrication intermediate product comprising carrier substrate 10, adhesive film 11 and a glass substrate 1 with one or more semiconductor components 9 fixed in corresponding cutouts 2 by means of the potting compound 12 is thus implemented. FIG. 5a shows a glass substrate 1 with a single semiconductor component 9, FIG. 5b with a plurality of components 9. In FIG. 5c, through holes 4 filled in part with a metallization 5 have been produced in the edge region with respect to the cutouts 2.

Figure 5D:
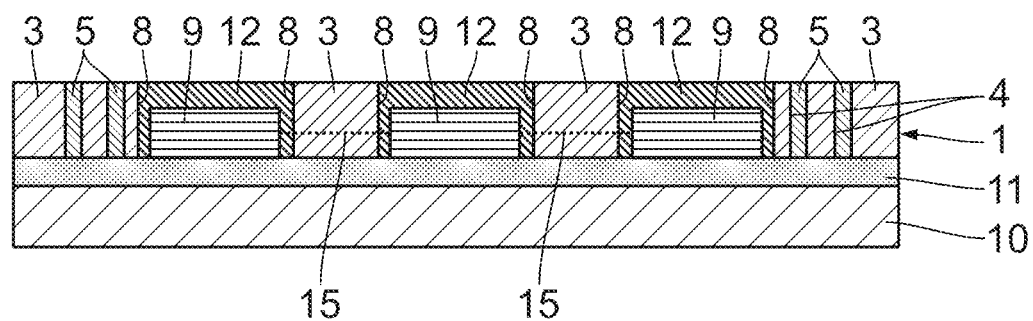

FIG. 5d shows the use of a transparent potting compound 12, thereby enabling an optical data communication 15 between the semiconductor components 9 through the transmissive glass substrate 1.

Figure 6A:
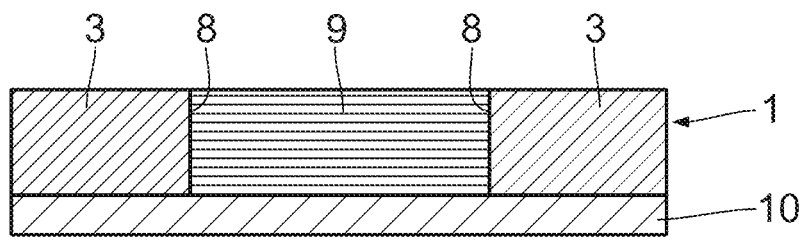
FIGS. 6a-6c show schematic vertical sectional illustrations of various further embodiments of an integrated semiconductor wafer device as a fabrication intermediate product.

In the embodiment shown in FIG. 6a, the cutout 2 in the glass substrate 1 has been cut so narrowly that the semiconductor component 9 is pre-fixed on the carrier substrate 10 in its position in this plane virtually in direct contact with the partition wall 3.

Figure 6B:
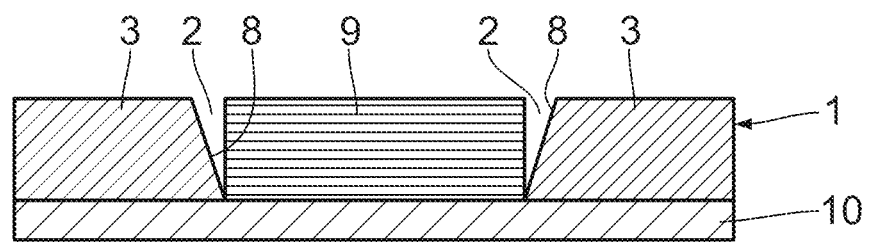

FIG. 6b takes up the configuration illustrated in FIG. 3, in which the sidewall surfaces 8 of the glass substrate of the are inclined at a flank angle. In this case, the open bottom surface of the cutout 2 is in turn dimensioned such that the semiconductor component 9 bears by its base region against the lower edge of the inclined sidewall surface 8 and a pre-fixing of the position of the component thus likewise takes place.

Figure 6C:
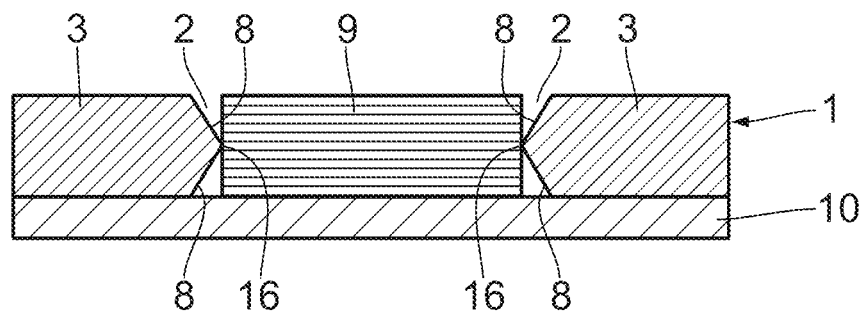

The same effect is achieved in the embodiment illustrated in FIG. 6c by virtue of the fact that two opposite sidewall surfaces 8 are each provided with V-shaped projections 16 approximately at half their height, the semiconductor components 9 bearing against said projections.

Figure 7:
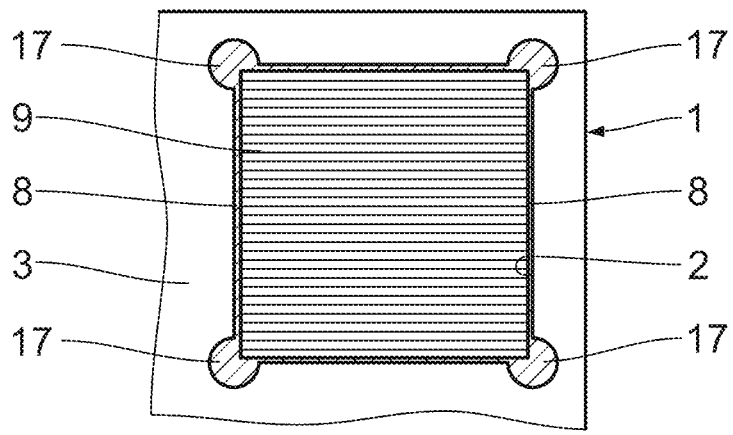
FIGS. 7-9 show schematic, partial plan views of various further embodiments of an integrated semiconductor wafer device.
Figure 8:
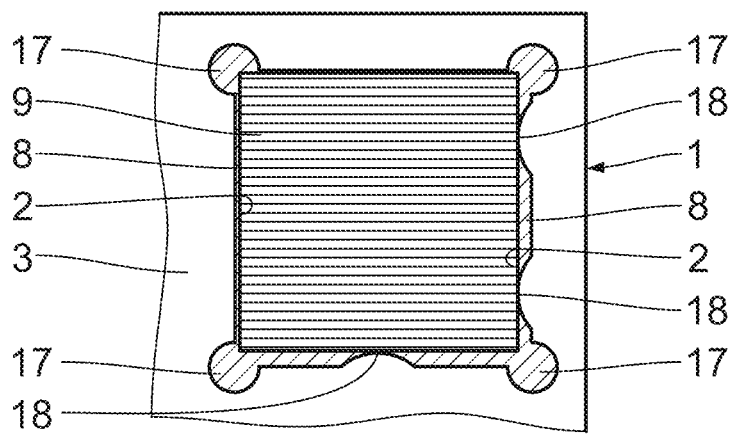
Figure 9:
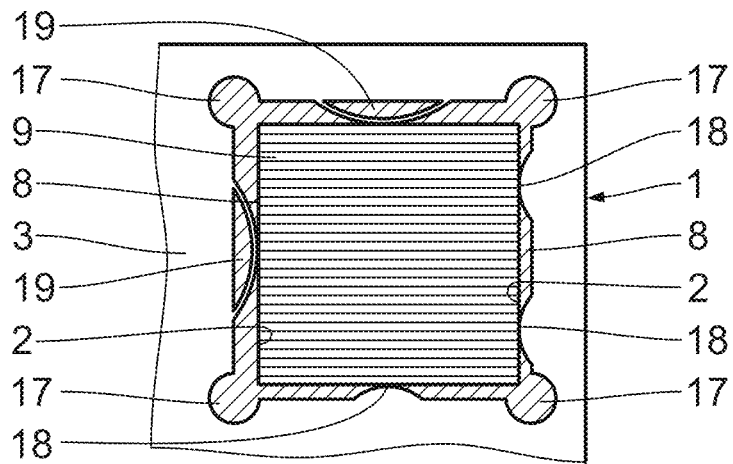

In order to counteract tilting/jamming of the component 9 in the course of the tight fitting of semiconductor components 9 in respective cutouts 2 of the glass substrate 1, it is possible—as is illustrated in FIGS. 7-9—to create, in the corner regions of the respective cutout 2, recesses 17 for the corners of the components 9 in the glass substrate 1.

In the embodiment in accordance with FIG. 8, stops 18 protruding from the sidewall surface 8 are additionally arranged at the glass substrate 1, thereby avoiding so-called "overdeterminations" in the fixing of the position of the semiconductor component 9 in the cutout 2.

In the last embodiment in accordance with FIG. 9, finally, the pre-fixing of the semiconductor component 9 is finally also additionally optimized further by two spring elements 19 in the sidewall surfaces 8 of the glass substrate 1 that are opposite the stops 18. It should be pointed out, however, that the structural elements recess 17, stop 18 and spring element 19 can also be used separately, in each case individually or else in various combinations in different cutouts 2 of an integrated semiconductor wafer device.

The invention claimed is:

1. A method for the integration of at least one semiconductor component in a confined space for 3D integration, in which, after positioning relative to at least one of the group comprising a carrier substrate and a redistribution layer (RDL), the at least one semiconductor component is protected and fixed in a relative position by introduction of a potting compound, wherein before the introduction of the potting compound, a glass substrate having a multiplicity of cutouts separated by partition walls and serving to receive in each case at least one semiconductor component is positioned in such a way that the at least one semiconductor component is enclosed by the sidewall surfaces—facing it—of the respective partition walls of the glass substrate, wherein the material thickness of the glass substrate is less than 500 µm and wherein the ratio of a maximum remaining wall thickness of the partition walls between two cutouts in the glass substrate to the material thickness of the substrate is less than 1:1, wherein the semiconductor components are fixed in the respective cutout by contact with at least one sidewall surface before the introduction of the potting compound, and wherein at the respective sidewall surface at least one of the group comprising one or more projections and spring elements are used for fixing the semiconductor components.

2. The method as claimed in claim 1, wherein the cutouts are embodied as one of the group comprising through holes and blind holes.

3. The method as claimed in claim 1, wherein through holes are introduced into the glass substrate, at least individual through holes of which are provided with a metallization for through plating before the fixing of the relative position of the semiconductor components in the cutouts.

4. The method as claimed in claim 1, wherein recesses are introduced in the corner regions of the cutouts of the glass substrate.

5. The method as claimed in claim 1, wherein a transparent or transmissive polymer is used as the potting compound.

6. A method as claimed in claim 1, further comprising the following method steps:
   providing the carrier substrate having the at least one semiconductor component secured thereon by way of an adhesive layer,
   providing the glass substrate having at least one cutout,
   positioning the glass substrate on the adhesive layer of the carrier substrate in such a way that the at least one semiconductor component is arranged in the at least one cutout,
   embedding the at least one semiconductor component in the at least one cutout by the potting compound, and
   removing the carrier substrate and the adhesive film from the remaining package comprising the at least one semiconductor component, the glass substrate and the potting compound.

7. The method as claimed in claim 6, wherein a redistribution layer and contact elements thereon are applied to the package with electrical contact with the at least one semiconductor component.

8. The method as claimed in claim 7, wherein a redistribution layer and solder balls thereon are applied to the package with electrical contact with the at least one semiconductor component.

9. A device comprising a glass substrate for use in the method as claimed in claim 1.

10. An integrated semiconductor component device as a fabrication intermediate product produced according to a method as claimed in claim 1, comprising:
    a carrier substrate,
    an adhesive film arranged thereon,
    at least one semiconductor component secured on said adhesive film,
    a glass substrate secured on the adhesive film and having cutouts forming partition walls between them, in each of which cutouts one or more of the at least one semiconductor component are embedded with the potting compound.

11. An integrated semiconductor component device as a finished end product in the form of a fan-out package produced according to a method as claimed in claim 1, comprising:

a glass substrate having cutouts forming partition walls between them, in each of which cutouts one or more of the at least one semiconductor component is embedded with the potting compound, a redistribution layer in electrical contact with said one or more of the at least one semiconductor component, and contact elements on the redistribution layer.

12. The integrated semiconductor component device as claimed in claim 11, wherein the contact elements are solder balls.

13. The device as claimed in claim 9, wherein the distance between a sidewall surface of a partition wall and a semiconductor component is less than one of the following values: 30 µm, 20 µm, 10 µm and 5 µm.

14. The device as claimed in claim 9, wherein the distance between a sidewall surface of a partition wall and a semiconductor component in the region of projections of the sidewall surface is zero.

15. The device as claimed in claim 9, wherein the sidewall surfaces of the partition walls between the cutouts have a flank angle relative to the surface normal to the glass substrate of between 0° and 10°.

16. The device as claimed in claim 15, wherein the sidewall surfaces of the partition walls between the cutouts have a flank angle relative to the surface normal to the glass substrate of one of the group comprising <8° and <5°.

17. The device as claimed in claim 9, wherein two opposite sidewall surfaces of the partition walls form an at least one of the group comprising V-shaped and hourglass-shaped course for forming projections for fixing the semiconductor components in the respective cutout.

18. The device as claimed in claim 9, wherein the glass substrate at least substantially consists of an alkali-free glass.

19. The device as claimed in claim 18, wherein the glass substrate at least substantially consists of one of the group comprising an alumoborosilicate glass and a borosilicate glass.

20. The device as claimed in claim 9, wherein at least one of the group comprising one or more stops, projections and spring elements for fixing the semiconductor components are arranged at the respective sidewall surface.

21. The device as claimed in claim 9, wherein recesses in the corner regions of the cutouts of the glass substrate are introduced.

22. A method for the integration of at least one semiconductor component in a confined space for 3D integration, comprising:

positioning the at least one semiconductor component in a relative position relative to at least one of a carrier substrate and a redistribution layer, thereafter, protecting and fixing the at least one semiconductor component in the relative position by introduction of a potting compound, before the introduction of the potting compound, positioning a glass substrate having a multiplicity of cutouts separated by partition walls and serving to receive in each case at least one semiconductor component in such a way that the at least one semiconductor component is enclosed by and faces sidewall surfaces of respective partition walls of the glass substrate, wherein the cutouts forming the sidewall surfaces in the glass substrate are produced by laser induced deep etching, such that a ratio of a maximum remaining wall thickness of the partition walls between two cutouts in the glass substrate to a material thickness of the carrier substrate is less than 1:1.

23. The method as claimed in claim 22, wherein the semiconductor components are fixed in the respective cutout by contact with at least one sidewall surface before the introduction of the potting compound.

24. The method as claimed in claim 22, wherein through holes are introduced into the glass substrate, at least individual through holes of which are provided with a metallization for through plating before the fixing of the relative position of the semiconductor components in the cutouts.

25. The method as claimed in claim 22, wherein recesses are introduced in the corner regions of the cutouts of the glass substrate.

26. The method as claimed in claim 22, wherein a transparent or transmissive polymer is used as the potting compound.

27. The method as claimed in claim 22, wherein a redistribution layer and contact elements thereon are applied to the package with electrical contact with the at least one semiconductor component.

28. The method as claimed in claim 22, wherein a redistribution layer and solder balls thereon are applied to the package with electrical contact with the at least one semiconductor component.

29. The method a claimed in claim 22, wherein the distance between a sidewall surface of a partition wall and a semiconductor component is less than one of the following values: 30 µm, 20 µm, 10 µm and 5 µm.

30. The method a claimed in claim 22, wherein the sidewall surfaces of the partition walls between the cutouts have a flank angle relative to the surface normal to the glass substrate of between 0° and 10°.

31. A device comprising a glass substrate for use in the method as claimed in claim 22.

* * * * *